United States Patent [19]

Gehweiler

[11] B 3,914,702

[45] Oct. 21, 1975

[54] COMPLEMENTARY FIELD-EFFECT TRANSISTOR AMPLIFIER

[75] Inventor: William Frederick Gehweiler, Moorestown, N.J.

[73] Assignee: RCA Corporation, New York, N.Y.

[22] Filed: June 1, 1973

[21] Appl. No.: 365,834

[44] Published under the Trial Voluntary Protest Program on January 28, 1975 as document no. B 365,834.

[52] U.S. Cl. ...................... 330/13; 330/17; 330/18; 330/35

[51] Int. Cl.[2] ........................................... H03F 3/18

[58] Field of Search .......... 307/304; 330/13, 17, 18, 330/35, 30 D, 22, 38 M

[56] References Cited

UNITED STATES PATENTS 3,392,341 7/1968 Burns ................................ 307/304

*Primary Examiner*—Michael J. Lynch

*Assistant Examiner*—Lawrence J. Dahl

*Attorney, Agent, or Firm*—H. Christoffersen; S. Cohen

[57] ABSTRACT

A complementary field-effect transistor (FET) amplifier is biased to a given operating point by applying a reference potential to its input terminal and varying the operating potentials supplied to the amplifier in accordance with its output signal. At least one other complementary FET amplifier, integrated upon a common substrate with the first amplifier, receives operating potentials which also vary in accordance with the output signal of the first amplifier for maintaining the quiescent operating point of the other amplifier at a value substantially equal to the given operating point of the first amplifier.

18 Claims, 8 Drawing Figures

COMPLEMENTARY FIELD-EFFECT TRANSISTOR AMPLIFIER

This invention relates to amplifiers and particularly to amplifiers employing complementary field-effect transistors.

Complementary field-effect transistor (FET) circuits are widely used in digital logic applications. Such circuits are characterized in having high threshold levels, inherent structural simplicity, low power consumption and very high power gain. This latter characteristic results from the large impedance transformation inherent in the structure of such circuits which allows exceptionally high fan-out capability for driving other like logic circuits.

It is known that a complementary FET inverter, for example, may be used as an analog amplifier when suitably biased, and when so used it retains many of the desirable characteristics associated with its use in digital logic applications. Such amplifiers, however, have not found wide use in analog applications because of the difficulty of biasing a complementary FET inverter to a suitable operating point. The reason for this difficulty is that the input-output transfer function associated with such amplifiers is characterized in having a relatively narrow region where the output signal changes appreciably in response to changes in the input signal. This is a distinct advantage in digital applications where the resulting insensitivity to signals outside the narrow region provides the amplifier (inverter) with exceptionally high noise immunity compared to other logic families. On the other hand, this relatively narrow region of the transfer function requires precise control of applied bias when a complementary FET inverter is used in analog applications as an amplifier, and precision is difficult to achieve due to the relatively unpredictable nature of the transfer function concerned.

The two principal factors which contribute to uncertainty concerning the transfer function of a complementary FET amplifier relate to the manufacturing process used to make the amplifier and the environmental conditions that the amplifier is subjected to when in operation. Unit-to-unit variations in the manufacturing process are caused by a large number of variables such as geometry differences, mobility differences and so on. Similarly, the environmental conditions that a complementary FET inverter is subject to will also affect the transfer function. Examples of such environmental variables are absolute temperature, temperature gradients and various forms of radiation such as electrostatic, electromagnetic and nuclear radiation. Environmental effects are particularly difficult to compensate for, because the complementary transistors which form the inverter generally do not respond in the same way to identical temperature changes or identical radiation changes.

A prior art method of biasing a complementary FET amplifier comprises connecting a feedback resistor from the output of the amplifier to its input. As will be subsequently explained in detail from a consideration of the shape of a typical transfer characteristic curve, this biasing technique requires alternating-current coupling of the input signal to be amplified, results in degenerative feedback, does not maximize the derivative of the transfer function and produces a quiescent operating point which is a function of both the manufacturing and environmental effects previously discussed. In addition, the presence of the biasing resistor degrades the input impedance of the amplifier. A further difficulty with such an approach is that resistors, generally, are difficult to manufacture in an integrated circuit and require considerable chip area.

A need exists for a means of biasing a complementary field-effect transistor amplifier which automatically corrects the operating point of the amplifier for changes in environmental operating conditions and variations due to normal manufacturing tolerances. It would be particularly desirable if such an amplifier could be fabricated in integrated circuit form without employing resistors.

In an embodiment of the present invention, a first amplifier employing complementary field-effect transistors is biased at a desired quiescent operating point by translating the operating potentials supplied thereto from a second similar amplifier. The second amplifier is quiescently biased to a given operating point and its output voltage serves as a control voltage for controlling the operating potentials supplied to the first and second amplifiers.

The invention is illustrated in the accompanying drawings, of which:

Figure 1:
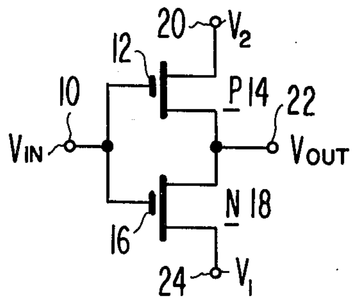
PRIOR ART FIG. 1
FIG. 1 is a schematic drawing of a prior art complementary field-effect transistor amplifier.

In the prior art complementary field-effect transistor amplifier of FIG. 1, input terminal 10 is coupled to control electrode 12 of P-type field-effect transistor 14 and also to control electrode 16 of N-type field effect transistor 18. The conduction path of transistor 14 is coupled between circuit point 20 and output terminal 22. Similarly, the conduction path of transistor 18 is coupled between circuit point 24 and output terminal 22.

In operation, circuit point 20 receives an operating potential which is relatively positive compared to an operating potential supplied to circuit point 24 for the transistor types shown. It is known that field-effect transistors so connected behave in a manner generally analogous to voltage controlled resistors. For example, if transistor 18 is an N-type enhancement mode field-effect transistor, the resistance of its conduction path will tend to decrease as an increasing voltage (which is greater than $V_1$) is applied to control electrode 16. Conversely, if transistor 14 is a P-type enhancement mode field-effect transistor, the resistance of its conduction path will tend to decrease when a decreasing voltage (less than $V_2$) is applied to control electrode 12. Since control electrodes 12 and 16 are both connected to input terminal 10, the resistances of the conduction paths of transistors 14 and 18 vary in a complementary fashion in response to an input signal applied to input terminal 10 and the potential at output terminal 22 is determined by the ratio of the resistances of the conduction paths of transistors 18 and 14 and by the magnitude of the potentials applied to circuit points 24 and 20.

Figure 2:
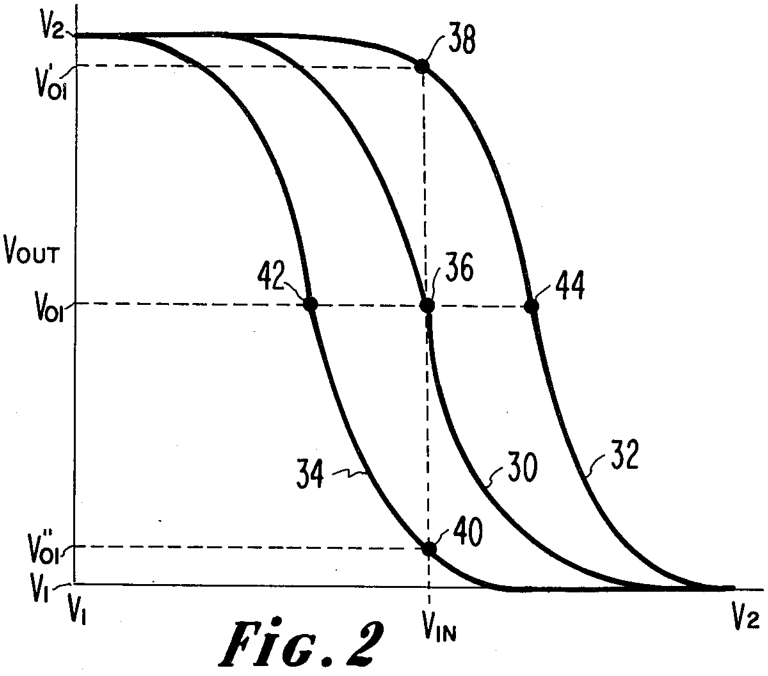
FIG. 2 is a diagram of the input-output transfer function of the amplifier of FIG. 1.

FIG. 2 illustrates in more detail the relationship between the input and output signals of the prior art amplifier of FIG. 1. The output voltage produced at terminal 22, $V_{out}$, is seen to vary in accordance with voltage applied to input terminal 10, $V_{in}$, as is illustrated by typical transfer function 30. This illustrates a transfer function that would result if transistors 14 and 18 were truly complementary, that is, if the resistances of the conduction path of transistor 14 were equal to the resistance of the conduction path of transistor 18, when the input voltage applied to input terminal 10 was halfway between the operating potentials applied to terminals 20 and 24. In practice, however, characteristics of the transistors may not be ideally matched, in which case the transfer function of the amplifier may be offset as illustrated by transfer functions 32 and 34. Some of the factors which may account for offsetting the transfer function are differences in geometry of transistors 14 and 18, differences in carrier mobilities of the transistors, and inherent structural differences in the devices which are normally expected to occur during the manufacturing process. Even if the transistors are perfectly matched to produce the transfer function such as 30, in FIG. 2, environmental effects which occur in normal operation amplifiers can cause transfer function 30 to shift as illustrated by transfer functions 32 and 34. Examples of such environmental effects are electrostatic, electromagnetic, and nuclear radiation, absolute temperature, thermal gradients, and so on. In practice, then, one may not predict precisely the location of the transfer function of the prior art amplifier. The effect of this uncertainty makes biasing such an amplifier difficult in small signal applications.

Assume, for example, that a given amplifier has a transfer characteristic such as transfer function 30 illustrated in FIG. 2 and that the input voltage is nominally midway between operating potentials $V_1$ and $V_2$ applied to circuit points 24 and 20, respectively. In such a case, an output voltage $V_{01}$ will be produced corresponding to operating point 36 on transfer function 30. The slope of transfer function 30, at operating point 36, represents the small signal voltage gain of the amplifier and is typically a maximum when the output voltage is nominally halfway between the supplied operating potentials $V_1$ and $V_2$. However, due to the manufacturing and environmental effects previously noted, the actual transfer function of the amplifier may be given by curves such as 32 or 34. If $V_{in}$ remains unchanged, the actual operating point will correspond to operating points 38 and 40, respectively, producing output voltages $V'_{01}$, or $V''_{01}$, respectively. Since the slope of transfer functions 32 and 34 at operating points 38 and 40, respectivley, is less than the slope of transfer function 30 at operating point 36, the gain of the amplifier will be reduced. Furthermore, it is seen that the maximum small signal symmetrical output voltage which can be produced is also less than at operating point 36. In other words, both the amplifier gain and its dynamic range have been decreased due to the undesirable shifting of the transfer function.

It is significant to note that, regardless of which transfer function (30, 32, 34) actually represents the true transfer function of the amplifier, an operating condition represented by an output voltage ($V_{01}$) of a value nominally midway between the operating potentials supplied to the circuit points 24 and 20 produces maximum gain and maximum dynamic range for the amplifier.

In other words, the ideal operating point for the prior art amplifier of FIG. 1 corresponds to operating points 42, 36, or 44. This operating point can be achieved according to the present invention by translating the operating potentials supplied to circuit points 24 and 20 in such a manner as to maintain output terminal 22 at a quiescent value nominally equal to the quiescent voltage applied to input terminal 10.

Figure 3:
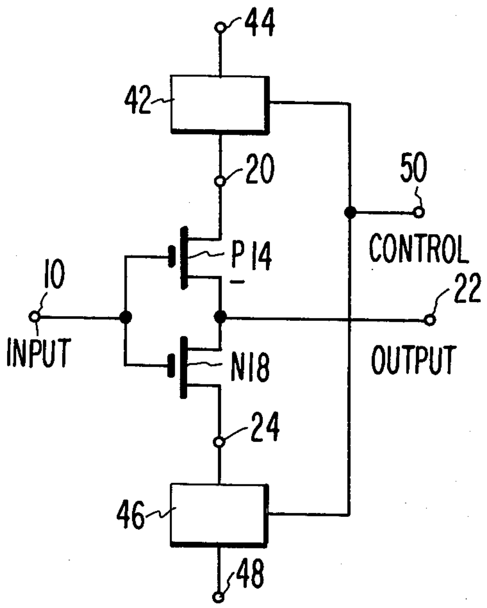
FIG. 3 is a schematic diagram of a voltage translating circuit.

The voltage translating circuit of FIG. 3 includes the prior art amplifier of FIG. 1 wherein like reference numerals, designate like elements. Variable impedance means 42 is coupled between circuit point 20 and circuit point 44. Variable impedance means 46 is coupled between circuit point 24 and circuit point 48. Each variable impedance means is also coupled to control terminal 50.

Variable impedance means 42 is selected to have an impedance which varies in a given sense in response to signals present on control terminal 50. Variable impedance means 46 is selected to have an impedance which varies in a sense opposite to that of variable impedance means 42 in response to same signals present on control terminal 50.

In the operation of this circuit, assume that circuit point 44 is maintained at a fixed potential of a relatively positive value, that circuit point 48 is maintained at a fixed potential of a relatively negative value, and that input terminal 10 is maintained at a reference level such as ground. Assume, further, that the impedance of variable impedance means 42 varies directly with a control voltage applied to control terminal 50 and that the impedance of variable impedance means 46 varies inversely with a control voltage applied to terminal 50. If the voltage applied to control terminal 50 is increased, the impedance of variable impedance means 46 will decrease while that of variable impedance means 42 will increase. This will have the effect of translating the potentials at circuit points 24 and 20 toward the fixed potential of circuit point 48. Conversely, if the voltage applied to control terminal 50 decreases, variable impedance means 42 and 46 will, in effect, translate the operating voltages of circuit points 20 and 24, towards the fixed operating potential of circuit point 44.

Since, as was previously discussed, the prior art amplifier of FIG. 1 produces an output voltage which is determined by the resistance ratio of transistors 14 and 18 and the operating potentials supplied to circuit points 20 and 24, and, since those operating potentials are influenced by the voltage supplied to control terminal 50, it follows that the voltage present on output terminal 22 can be placed at a desired value by changing the voltage applied to control terminal 50 in an appropriate manner as will be subsequently described.

Figure 4:
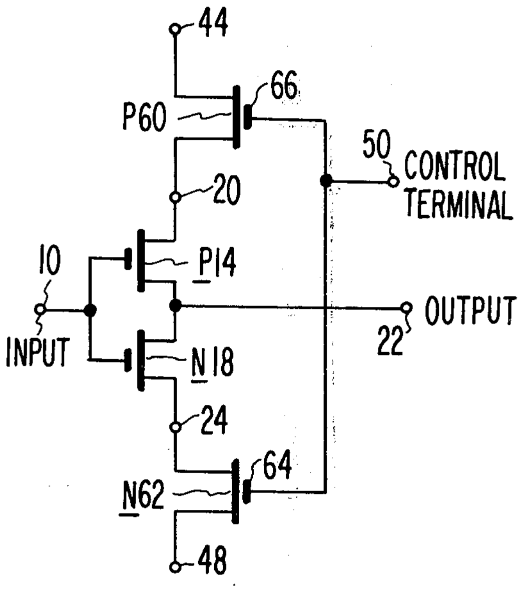
FIG. 4 is a circuit diagram of a voltage translating circuit employing field-effect transistors.

FIG. 4 illustrates the use of field-effect transistors to perform the function of the variable impedance means utilized in FIG. 3. In FIG. 4, P-type field-effect transistor 60 has its conduction path coupled between circuit point 44 and circuit point 20. The conduction path of N-type field-effect transistor 62 is coupled between circuit point 48 and circuit point 24. The control electorde 64 of transistor 62 and the control electrode 66 of transistor 60 are connected to control terminal 50. Operation of the circuit of FIG. 4 is as was described by the voltage translating circuit of FIG. 3. A control voltage applied to control terminal 50 will produce a complementary variation of the impedance of the conduction paths of transistors 60 and 62 in response to changes in the control voltage applied to control terminal 50. This, in turn, will effectively translate the operating potentials at circuit points 20 and 24 of the prior art amplifier in the manner previously described.

In one embodiment of the present invention, a circuit such as that illustrated in FIG. 4 is utilized as a reference amplifier in the following manner. Assume that equal magnitude positive and negative voltages are applied to circuit points 44 and 48 respectively, and that input terminal 10 is maintained at a reference level such as ground. Transistors 14 and 18 operate as the prior art amplifier of FIG. 1 having transfer characteristics such as those illustrated in FIG. 2. An output voltage will be produced at output terminal 22 which will have a value which depends upon the transfer characteristic exhibited by the amplifier. If, for example, the actual transfer curve is that given by curve 30 of FIG. 2, an operating point 36 will result producing an output voltage corresponding to $V_{01}$ in FIG. 2 (i.e., ground level under the assumptions given). If, on the other hand, the transfer curve is given by curve 32, the corresponding operating point would be operating point 38 producing a positive output voltage $V'_{01}$, at output terminal 22. Similarly, if the transfer function is given by curve 34, an operating point 40 results giving a negative output voltage $V''_{01}$ at output terminal 22.

It is thus seen that the voltage produced at output terminal 22 is representative of both the magnitudes and the direction of the shift of the transfer function compared to the ideal location of the transfer function 30. In the present invention, this voltage is utilized for translating the operation potentials, as previously described, for maintaining output terminal 22 at a quiescent value nominally equal to the voltage applied to input terminal 10.

One means of accomplishing this purpose is simply to couple control terminal 50 to output terminal 22. This, in effect, provides a negative feedback voltage for translating the operating potentials applied to circuit points 20 and 24 which will tend to change the output voltage on output terminal 22 in such a manner as to be more nearly equal to the reference voltage applied to input terminal 10.

It is also used, according to the present invention, to control quiescent operating points in other similar amplifiers by connecting the control terminals of each of the other amplifiers to the output terminal of the reference amplifier. If the transistors used in other amplifiers have similar characteristics to the transistors used in the reference amplifier, the output voltage produced by the reference amplifier will thus provide a measure of compensation for the manufacturing and environmental conditions previously described. Similar characteristics may be obtained, for example, by selection of the transistors or by integrating each amplifier upon a common substrate.

Figure 5:
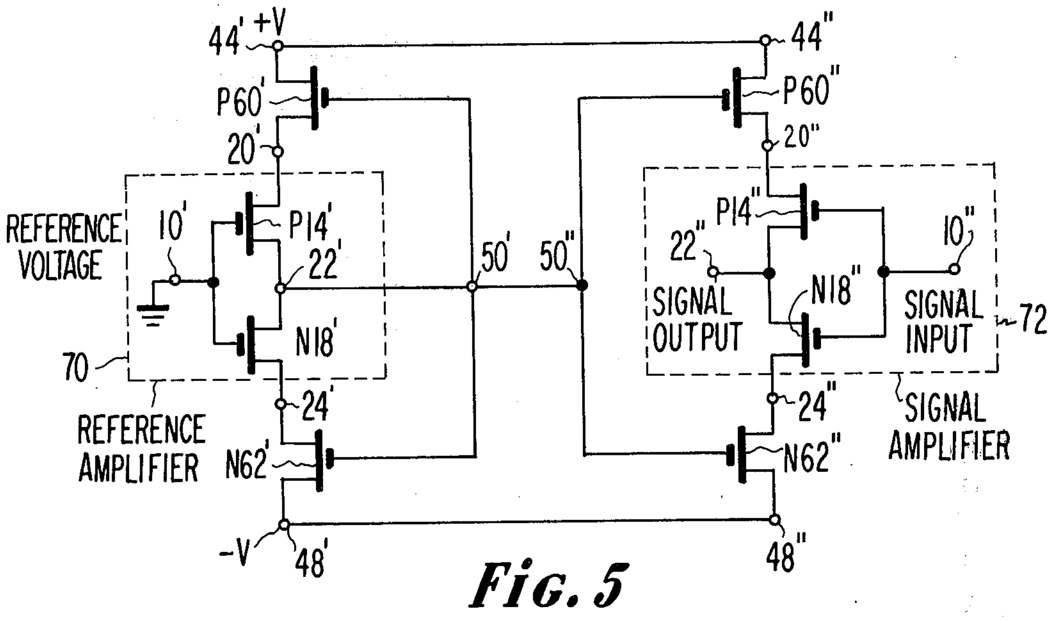
FIG. 5 illustrates one embodiment of the present invention.

FIG. 5 illustrates one application of the present invention which comprises an inter-connection of a pair of the circuits illustrated in FIG. 4. Primed elements in FIG. 5 correspond to the same elements in FIG. 4. Circuit points 44′ and 44″ are coupled in common to a source of voltage, +V. Terminals 48′ and 48″ are coupled in common to a source of voltage, −V. Input terminal 10′ is coupled to a source of reference voltage which may be ground. Output terminal 22′ is coupled to control terminal 50′ and control terminal 50″. Input terminal 10″ is adapted to receive an input signal to be amplified and output terminal 22″ provides an output signal representative of the input signal.

Each corresponding transistor of a given conductivity type has matched operating characteristics. For example, P-type transistor 60′ has characteristics similar to P-type transistor 60″. Similarly, P-type transistor 14′ has similar characteristics to P-type transistor 14″. It is not necessary to the present invention that P-type transistor 14′ have matched characteristics to P-type transistor 60′. It is only necessary that its characteristics be matched to the corresponding P-type transistor 14″. Transistors 14′ and 18′ comprise reference amplifier 70, transistors 14″ and 18″ comprise signal amplifier 72.

The operation of the circuit is as follows. Upon application of the operating potentials +V and −V, output terminal 22′ will produce the voltage dependent upon the particular transfer characteristic of the transistors associated therewith. This output voltage is fed back to control terminal 50′ to translate the operating potentials applied to reference amplifier 70 at circuit points 20′ and 24′ in such a sense as to decrease the difference between the output voltage produced at output terminal 22′ and the reference voltage applied to input terminal 10′.

An input signal to be amplified is applied to input terminal 10″ of signal amplifier 72. Control terminal 50″, being connected to output terminal 22′ of reference amplifier 70, operates to effectively translate operating potentials present on circuit points 20″ and 24″ in such a manner as to place output terminal 22″ at a quiescent operating point essentially equal to the operating point of output terminal 22′.

Due to the similarity between corresponding transistors in reference amplifier 70 and signal amplifier 72, changes which occur in the transfer function of reference amplifier are similar to changes which occur in the transfer function of signal amplifier 72. The feedback path from output terminal 22′ to control terminal 50′ in reference amplifier 70 stabilizes the operating point of the reference amplifier to a value near that of the reference voltage applied to input terminal 10′. This same voltage similarity stabilizes the quiescent operating point of signal amplifier 72.

The circuit of FIG. 5 is intended to be representative. The single stabilized signal amplifier 72 illustrated may, in practice, be two, three or a larger number of amplifiers, all with separate input and output terminals and all with the gate electrodes of transistors corresponding to 60″ and 62″ connected to terminal 50′.

A signal amplifier such as amplifier 72 biased to a quiescent operating point in the manner of FIG. 5 has a number of distinct advantages over prior art amplifier biasing techniques. For example, there is no feedback path from the signal terminal 10″ to the signal output terminal 22″, such as is commonly employed in complementary transistor amplifiers. This results in a high input impedance, a lack of degenerative feedback, and allows direct coupling of such signal amplifiers.

Figure 6:
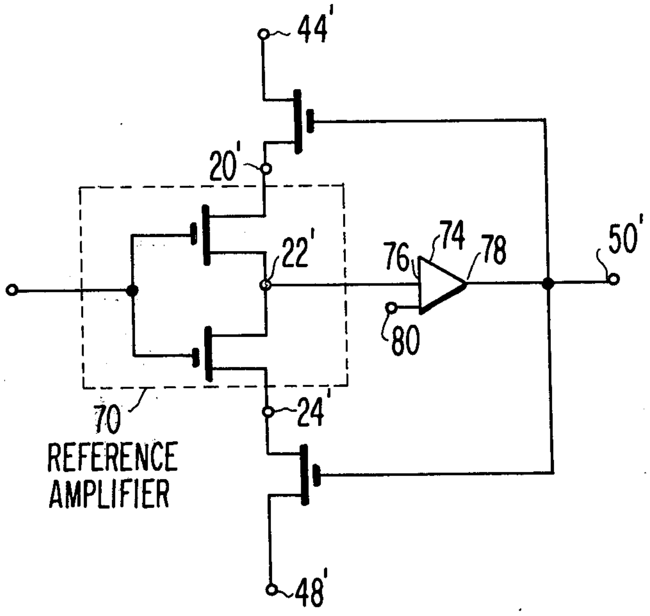
FIG. 6 illustrates a modification of the reference amplifier portion of FIG. 5.

More accurate compensation of the operating point of the amplifiers illustrated in FIG. 5 may be obtained by employing an additional amplifier in the reference amplifier portion of the present invention. The additional amplifier may be another field-effect transistor amplifier, an operational amplifier or another suitable amplifier responsive to direct current signals. In FIG. 6, for example, amplifier 74 has a non-inverting input terminal 76 coupled to output terminal 22' of reference amplifier 70 of FIG. 5. Output terminal 78 of amplifier 74 is coupled to control terminal 50'. Amplifier 74 may also include an additional input terminal 80. In this modification of the reference amplifier portion of FIG. 5, amplifier 74 serves the function of amplifying (without inversion) the output signal present at output terminal 22' and applying the signal so produced to terminal 50'. The effect of this amplification is to apply a larger signal to control terminal 50' for more fully correcting changes in the transfer function of reference amplfier 70. In addition, amplifier 74 may include an input terminal 80 for receiving an offset voltage if such is desired in a given application. For example, such offset voltages may be desirable in utilizing the signal amplifier as a logic level translator for amplifying low level logic signals having one reference value to higher level signals having a different reference value (ECL or TTL to MOS translation).

Figure 7:
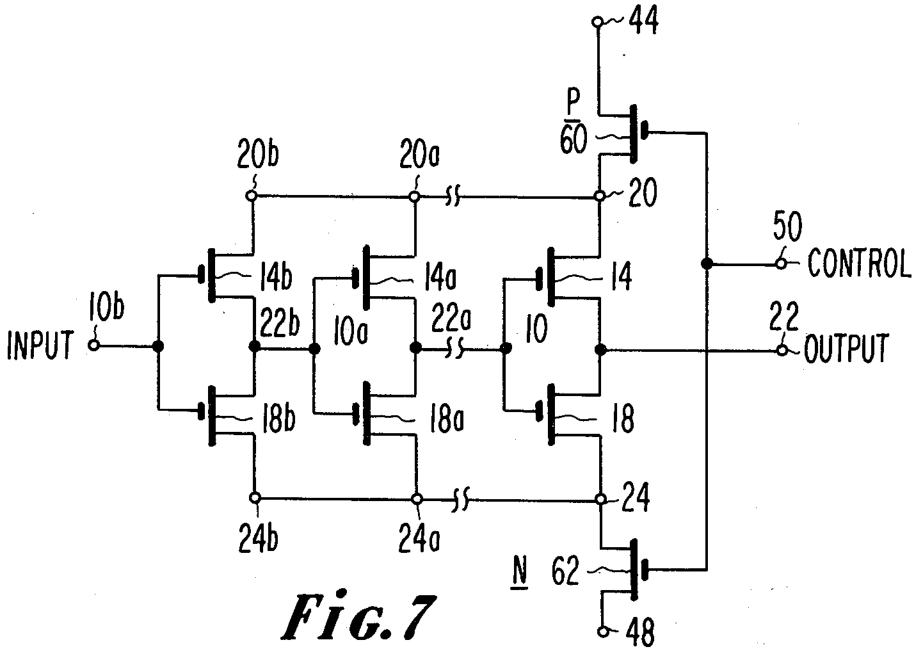
FIG. 7 is a circuit diagram illustrating a modification of the voltage level translating circuit of FIG. 4.

FIG. 7 illustrates a modification of the circuit of FIG. 4 which is suitable for use either as a reference amplifier 70 or signal amplifier 72 as in FIG. 5. In FIG. 7, additional amplifiers indicated by the subscripted numbers are cascade connected to obtain additional gain in the amplifier portion of the circuit. Transistors 60, 14, 18 and 62 are connected as described in FIG. 4. In addition, the input terminal 10 of the amplifier employing transistors 14 and 18 is coupled to the output terminal **22*a* of the amplifier employing transistors 14*a* and 18*a*. Input terminal 10*a* of that amplifier is connected to the output terminal 22*b* of an amplifier employing transistors 14*b* and 18*b*. Input terminal 10*b* of that amplifier is adapted to receive an input signal. Circuit points 20,** 20*a* and **20*b* are connected in common. Circuit points 24, 24*a* and 24*b*** are connected in common.

Since an even number of additional amplifier stages have been added in cascade there is no net signal inversion caused by the additional stages and output terminal 22 may be connected to control terminal 50 to operate this circuit in the manner of reference amplifier 70 in FIG. 5. If, on the other hand, an odd number of additional stages had been included, a net signal inversion would be produced and it would be necessary to invert the output signal at output terminal 22 before applying it to control terminal 50 in order to maintain negative feedback for stabilizing the operating point of the amplifier.

Figure 8:
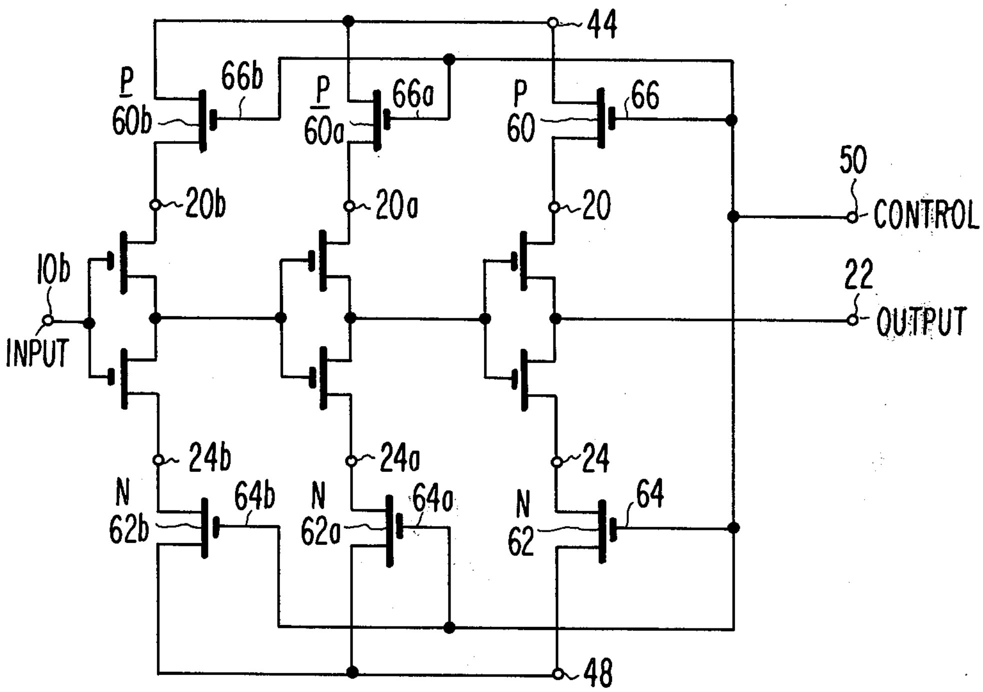
FIG. 8 is a circuit diagram illustrating a modification of the circuit of FIG. 7.

FIG. 8 illustrates a variation of the circuit of FIG. 7 which includes additional transistors **60*a***, 60*b*, **62*a*, and 62*b*. The conducting path of transistor 60*a* is coupled between circuit points 44 and 20*a*. The conduction path of transistor 60*b* is coupled between circuit point 44 and circuit point 20*b*. Control electrodes of transistors 60a and 60b are connected in common with control terminal 50. The conduction path of transistor 62*a* is coupled between circuit point 48 and circuit point 24*a* and the conduction path of transistor 62*b* is coupled between circuit point 48 and circuit point 24*b*. Control electrodes 64*a* and 64*b* are each connected to control terminal 50. Circuit points 20*a* and 20b which were previously connected in common with circuit point 20 in FIG. 7 are isolated therefrom in FIG. 8. Similarly, circuit points 24*a* and 24*b* which were previously connected in common at circuit point 24 in FIG. 7 are isolated therefrom in FIG. 8.**

The circuit of FIG. 8 operates in the same manner as the circuit of FIG. 7. The distinguishing factor is the additional transistors in each stage of the amplifier. These transistors provide more isolation between amplifier stages than that afforded in FIG. 7. As in FIG. 7, a plurality of the cascade connected amplifier stages may be employed and the circuit may be used either as a reference amplifier or as the signal amplifier in the manner previously described.

In the preferred embodiments of the present invention, voltage translating circuits (FIG. 3, for example) have been employed to form bias compensated amplifiers. It will be appreciated by those skilled in the art that the voltage translating circuits herein disclosed may be used in other applications where it is desired to produce an output signal which is jointly representative of two input signals. The circuit of FIG. 4, for example, may be used generally as a signal translating or summing circuit by applying a source of external bias to the signal input terminal and externally biasing the control terminal to a similar level.

What is claimed is:

1. In combination:

a plurality of amplifiers, each amplifier employing at least one pair of complementary field-effect transistors, each transistor of a given conductivity type being substantially similar to all other corresponding transistors of the same given conductivity type, each amplifier having an operating point which is responsive both to an input signal and operating potentials supplied to the amplifier and producing an output signal representative thereof;

means for supplying quiescent bias at a reference voltage level to a selected amplifier of said plurality of amplifiers for establishing an operating point thereof;

means for supplying a signal to be amplified to at least one other amplifier of said plurality of amplifiers; and control circuit means receptive of first and second substantially fixed potentials and responsive to the output signal produced by said selected amplifier for separately applying said operating potentials to each amplifier and changing the values of said operating potentials, as said output signal of said selected amplifier changes, in a sense to establish the operating points of all the amplifiers at stable and substantially identical values within a substantially linear amplification region associated with each amplifier.

2. The combination recited in claim 1 wherein each pair of complementary field-effect transistors is integrated upon a common substrate to obtain substantially similar characteristics between each transistor of a given conductivity type and all other corresponding transistors of the same conductivity type.

3. The combination recited in claim 1 wherein said transistors are selected to obtain substantially similar characteristics between each transistor of a given conductivity type and all other corresponding transistors of the same conductivity type.

4. The combination as set forth in claim 1 wherein each said amplifier comprises:

first and second complementary field-effect transistors, each having a conduction path and a control electrode for controlling the conduction of the path;

an input terminal coupled to the control electrodes of both transistors for receiving said input signal;

an output terminal coupled to one end of the conduction path of each transistor for providing said output signal; and a pair of terminals, each separately coupled to the other ends of the conduction paths for receiving said operating potentials.

5. The combination recited in claim 4 wherein at least one of said amplifiers includes multiple stages of said first and second complementary field-effect transistors having said input and said output terminals thereof connected in cascade.

6. The combination recited in claim 5 wherein corresponding ones of each said pair of terminals of each said stage of said multiple stages are connected in common for receiving a single set of said operating potentials for jointly controlling the operating points of each stage of the multiple stages of said at least one amplifier.

7. The combination recited in claim 4 wherein said control circuit means comprises:

first and second circuit points for receiving said first and second substantially fixed potentials, respectively;

first variable impedance means separately coupling one of said pair of terminals of each amplifier to said first circuit point and having an impedance which varies in a given manner in response to the output signal produced by said selected amplifier; and second variable impedance means separately coupling the other of said pair of terminals of each amplifier to said second circuit point and having an impedance which varies in a manner opposite to that of said first variable impedance means in response to said output signal produced by said selected amplifier.

8. The combination recited in claim 7 wherein:

said first variable impedance means comprises a separate field-effect transistor having a conduction path of a first conductivity type coupled between each said one of said pair of terminals of each amplifier and said first circuit point;

said second variable impedance means comprises another separate field-effect transistor having a conduction path of a second conductivity type coupled between said other of said pair of terminals of each amplifier and said second circuit point;

each transistor having a control electrode for controlling the conduction of its respective path, means coupling each control electrode in common; and means coupling the commonly connected control electrodes to the output terminal of said selected amplifier.

9. The combination recited in claim 8 wherein said means coupling the commonly connected control electrodes to the output terminal of said selected amplifier comprises a different amplifier for both amplifying the signal present on said output terminal of said selected amplifier and adding thereto an offsetting potential for translating the operating points of each of said plurality of amplifiers in response to an offsetting signal supplied to said different amplifier.

10. In combination:

an amplifier comprising first and second complementary field-effect transistors, each transistor having a conduction path and a control electrode for controlling the conduction of the path, an input terminal coupled to the control electrodes of both transistors for receiving an input signal, an output terminal insulated from said input terminal and coupled to one end of the conduction path of each transistor for providing an output signal representative of said input signal, and a pair of terminals separately coupled to the other ends of said conduction paths, one terminal of the pair for receiving a first operating potential and the other terminal of the pair for receiving a second operating potential; and control circuit means receptive of first and second fixed potentials and coupled to said one terminal and said other terminal for applying said first and second operating potentials to said one and said other terminal, respectively, said control circuit means being responsive to a control signal for changing the values of said operating potentials, each in the same sense, in response to a change in a given sense in said control signal, whereby said output signal produced as said output terminal is jointly representative of said input signal and said control signal.

11. The combination recited in claim 10 wherein said control circuit means comprises:

first and second circuit points for receiving said first and second fixed potentials respectively;

first variable impedance means coupled between said first circuit point and one of said pair of terminals and having an impedance which varies in a given sense in response to said control signal; and second variable impedance means coupled between said second circuit point and the other of said pair of terminals, the impedance of which varies in a sense opposite to that of said first variable impedance means in response to said control signal.

12. The combination recited in claim 11 further comprising a control terminal for receiving said control signal and wherein the first and second variable impedance means comprises a pair of complementary field-effect transistors, each transistor having a conduction path and a control electrode for controlling the conduction of the path, one transistor having its conduction path coupled between said first circuit point and said one of said pair of terminals, the other transistor having its conduction path coupled between said second circuit point and said other of said pair of terminals and the control electrode of each transistor coupled in common to said control terminal.

13. The combination of:

a complementary symmetry field-effect transistor amplifier comprising a P-type transistor, a N-type transistor, each transistor having a conduction path and a control electrode for controlling the conductance of said path, said two paths connected in series between first and second operating voltage terminals, an output terminal at the connection of said two paths, and an input terminal insulated from said output terminal and connected to both control electrodes;

means coupled to said input terminal for quiescently biasing said amplifier at an operating point at which both transistors conduct;

terminals for a voltage source; and means coupled to said terminals for said voltage source and to said output terminal and responsive to the output voltage at said output terminal for controlling the operating voltages applied to said first and second terminals to values to stabilize the operation of said amplifier at said operating point.

14. The combination of claim 13 wherein:

said means coupled to said output terminal comprises first and second voltage controlled impedance means, one of the type exhibiting an impedance which increases in response to an increasing control voltage and the other of the type exhibiting an impedance which decreases in response to an increasing control voltage, said first impedance means connected between said terminals for said voltage source and said second impedance means connected between said second and fourth terminals, said output terminal being connected to both impedance means and the output signal at said output terminal serving as the control voltage for both impedance means.

15. The combination recited in claim 14 wherein said first and second voltage controlled impedance means comprises another P-type field-effect transistor and another N-type field effect transistor, respectively, each having a conduction path and a control electrode for controlling the conduction of the path, the conduction path of said another P-type transistor coupled between said third and first terminals, to the first mentioned P-type transistor, the conduction path of said another N-type transistor coupled between said second and fourth terminals to the first mentioned N-type transistor and the control electrodes of both transistors coupled to said output terminal for receiving said control voltage.

16. The combination recited in claim 15 wherein said means coupled to said input terminal comprises means for placing said input terminal at a reference level substantially equal to an average value of said relatively fixed operating voltages.

17. The combination recited in claim 12 further comprising:

a plurality of said amplifiers;

means coupling said one terminal of each of said amplifiers in common;

means coupling said other terminal of each of said amplifiers in common; and means directly coupling said plurality of amplifiers in cascade, the input terminal of a first one of said amplifiers for receiving said input signal and the output terminal of a last one of said amplifiers for providing said output signal.

18. The combination recited in claim 12 further comprising means coupling said control terminal to said output terminal.

* * * * *